United States Patent [19]

Irwin

[11] Patent Number: 5,450,080
[45] Date of Patent: Sep. 12, 1995

[54] KEYBOARD ENCODING

[75] Inventor: Jack Irwin, Saratoga, Calif.

[73] Assignee: Samsung Semiconductor, Inc., San Jose, Calif.

[21] Appl. No.: 872,806

[22] Filed: Apr. 22, 1992

[51] Int. Cl.⁶ .............................................. H03K 17/94
[52] U.S. Cl. ........................................... 341/26; 341/22
[58] Field of Search .................... 341/22, 26; 395/800; 364/709.06, 928.5, 928.6

[56] References Cited

U.S. PATENT DOCUMENTS

| | | | |
|---|---|---|---|
| 4,305,135 | 12/1981 | Dahl et al. | 341/33 |
| 4,485,455 | 11/1984 | Boone et al. | 395/800 |
| 4,617,479 | 10/1986 | Hartmann et al. | 395/800 X |
| 4,665,461 | 5/1987 | Bader | 341/26 X |
| 5,059,974 | 10/1991 | Wu | 341/26 X |
| 5,070,330 | 12/1991 | Wu | 341/26 |
| 5,101,429 | 3/1992 | Geboers | 341/26 X |
| 5,194,862 | 3/1993 | Edwards | 341/20 |
| 5,220,323 | 6/1993 | Ito et al. | 341/26 X |
| 5,220,601 | 6/1993 | Gulick et al. | 341/26 X |
| 5,280,283 | 1/1994 | Raasch et al. | 341/26 |

OTHER PUBLICATIONS

Rowe, Jr., "Dynamic Updating of Key–Sensing Thresholds", IBM Tech. Discl. Bull., vol. 27, No. 4A, Sep. 1984.

*Primary Examiner*—Brent Swarthout
*Assistant Examiner*—Thomas J. Mullen, Jr.
*Attorney, Agent, or Firm*—Skjerven, Morrill, MacPherson, Franklin & Friel; David H. Carroll

[57] ABSTRACT

A keyboard interface controller in the nature of a state machine is placed in a stop mode or an idle mode after initialization. In stop or idle mode, all the keyboard conductors associated with the X-axis are activated, while all keyboard conductors associated with the Y-axis are sensed. Upon being awakened by an interrupt upon key closure from which the Y-axis location of the closed key is determined, the controller sequences through the steps of (a) determining the X-axis of the keyboard by activating the determined Y-axis conductor and sensing the X-axis conductors; (b) converting the crosspoint to a unique code; (c) transmitting the crosspoint code to the host; and (d) checking for either another closure or the release of the closure detected. When all keys are released, the controller returns to stop or idle mode.

36 Claims, 4 Drawing Sheets

100: FIRST KEY CLOSURE EVENT DETECTION SEQUENCE

102: ACTIVE X LINES
    104: MONITOR Y LINES FOR INTERRUPT
    106: STOP/IDLE UNTIL OCCURRENCE OF Y LINE INTERRUPT
    108: TAG INTERRUPTED Y LINE
    110: ACTIVATE NEW TAGGED Y LINE
    112: MONITOR X LINES
    114: TAG ACTIVE X LINE
    116: COMMUNICATE X,Y CLOSURE LOCATION TO HOST

120: UNTAGGED X LINE KEY CLOSURE EVENT DETECTION SEQUENCE

122: ACTIVATE UNTAGGED X LINES
    124: MONITOR Y LINES
    126: IF NO ACTIVE Y LINE DETECTED GOTO 142
         ELSE CONTINUE
    128: TAG ACTIVE Y LINE
    130: ACTIVATE NEW TAGGED Y LINE
    132: MONITOR UNTAGGED X LINES
    134: TAG ACTIVE X LINE
    136: COMMUNICATE X,Y CLOSURE LOCATION TO HOST
    138: GOTO 122

140: TAGGED X LINE KEY CLOSURE AND RELEASE EVENT DETECTION SEQUENCE

142: ACTIVATE A TAGGED X LINE
    144: MONITOR A TAGGED Y LINE ASSOCIATED WITH THE ACTIVATED TAGGED X LINE
    146: IF MONITORED Y LINE ACTIVE GOTO 152 {KEY STILL CLOSED}
         ELSE CONTINUE {KEY RELEASED}
    148: REMOVE X,Y LOCATION TAG
    150: COMMUNICATE X,Y RELEASE LOCATION TO HOST
    152: IF OTHER TAGGED Y LINES ARE ASSOCIATED WITH THE ACTIVATED TAGGED X LINE GOTO 144
         ELSE CONTINUE

160: MONITOR UNTAGGED Y LINES {CHECK FOR NEW KEY CLOSURE}
    162: IF NO ACTIVE Y LINE GOTO 170 {NO NEW KEY CLOSURE}
         ELSE CONTINUE {NEW KEY CLOSURE}
    164: TAG ACTIVE Y LINE {X LINE KNOWN}
    166: COMMUNICATE X,Y CLOSURE LOCATION TO HOST

170: IF OTHER TAGGED X LINES GOTO 142
         ELSE CONTINUE

180: IF NO TAGGED X,Y LOCATIONS GOTO 102
         ELSE GOTO 122

Fig. 2

KEYBOARD ENCODING

BACKGROUND OF THE INVENTION

1. Field of the Invention

The invention relates to keyboard encoding and keyboard interface controllers.

2. Description of Related Art

Many different types of electronic systems including general purpose computer systems and calculators, receive manual input through a keyboard. U.S. Pat. No. 4,485,455, issued Nov. 27, 1984 to Boone et al., discloses a calculator that uses a programmed scanning system to provide keyboard encoding. The keyboard comprises an 11 by 4 array of normally open single pole, single throw switches. Each column of the array has four switches, and is connected to a digit driver line. Each row of the array has eleven switches, and is connected to a respective input line to the key input logic of a timing block. The eleven digit driver lines are sequentially scanned, and the four input lines are monitored. The detection of a signal on one of the input lines indicates that a key is depressed in the array, and the location of the key is the cross point of the active driver line and the input line on which the signal was detected.

Although having utility, the scanned keyboard is disadvantageous in some respects. To accommodate larger keyboards, the scanning frequency is increased. The scanning signal is a source of electromagnetic interference ("EMI"), which has become of more concern with the use of higher scanning frequencies. If lower scanning frequencies are used, the keyboard may not be able to react as quickly as desired. Moreover, the power consumption of the keyboard controller is considerable, especially when designed for large keyboards. Power consumption is a particular problem in systems having limited power resources, such as portable personal computers and workstations. Hence, a need has arisen for a novel approach to keyboard encoding.

SUMMARY OF THE INVENTION

The present invention is advantageous in many respects. EMI noise is not as severe a problem as in prior art keyboard encoders since the keyboard is not scanned. As the keyboard interface controller of the present invention may be placed in either a stop state or an idle state until a key is depressed, its power requirements are less than a conventional keyboard encoder implemented in a comparable process technology. The keyboard interface controller of the present invention may be implemented as a monolithic chip. The keyboard interface controller of the present invention is able to transmit data to the host in serial or parallel path. The keyboard controller of the present is not limited by scanning frequency, hence is inherently faster than a comparable scanning encoder.

These and other advantages are achieved in the present invention, which in one embodiment is a keyboard controller comprising a plurality of driver-sense amplifier pairs respectively associated with X- and Y- conductors of the keyboard. Control logic is provided to activate the drivers associated with the X-conductors and the sense amplifiers associated with the Y-conductors to identify a Y-conductor that is connected to a closed key, and to activate the driver associated with the identified Y-conductor and the sense amplifiers associated with the X-conductors to identify an X-conductor that is connected to the closed key.

Another embodiment of the present invention, a method for keyboard encoding, comprises associating each switch of a keyboard with a respective X,Y grid location, each switch having a terminal associated with the X location and another terminal associated with the Y location. A first signal is applied to the X-terminals of the switches while the Y-terminals of switches associated with the same Y grid location, for each Y grid location, are monitored to identify a Y location of a closed switch. A second signal is applied to the Y-terminals of the switches associated with the identified Y location of the closed switch, while the X-terminals of switches associated with the same X grid location, for each X grid location, are monitored to identify an X location of the closed switch. An X location and a Y location of the closed switch are thereby identified.

BRIEF DESCRIPTION OF THE DRAWINGS

FIG. 2 is a pseudocode representation of key closure and key release event detection sequences.

DETAILED DESCRIPTION OF THE PREFERRED AND OTHER EMBODIMENTS

Figure 1:
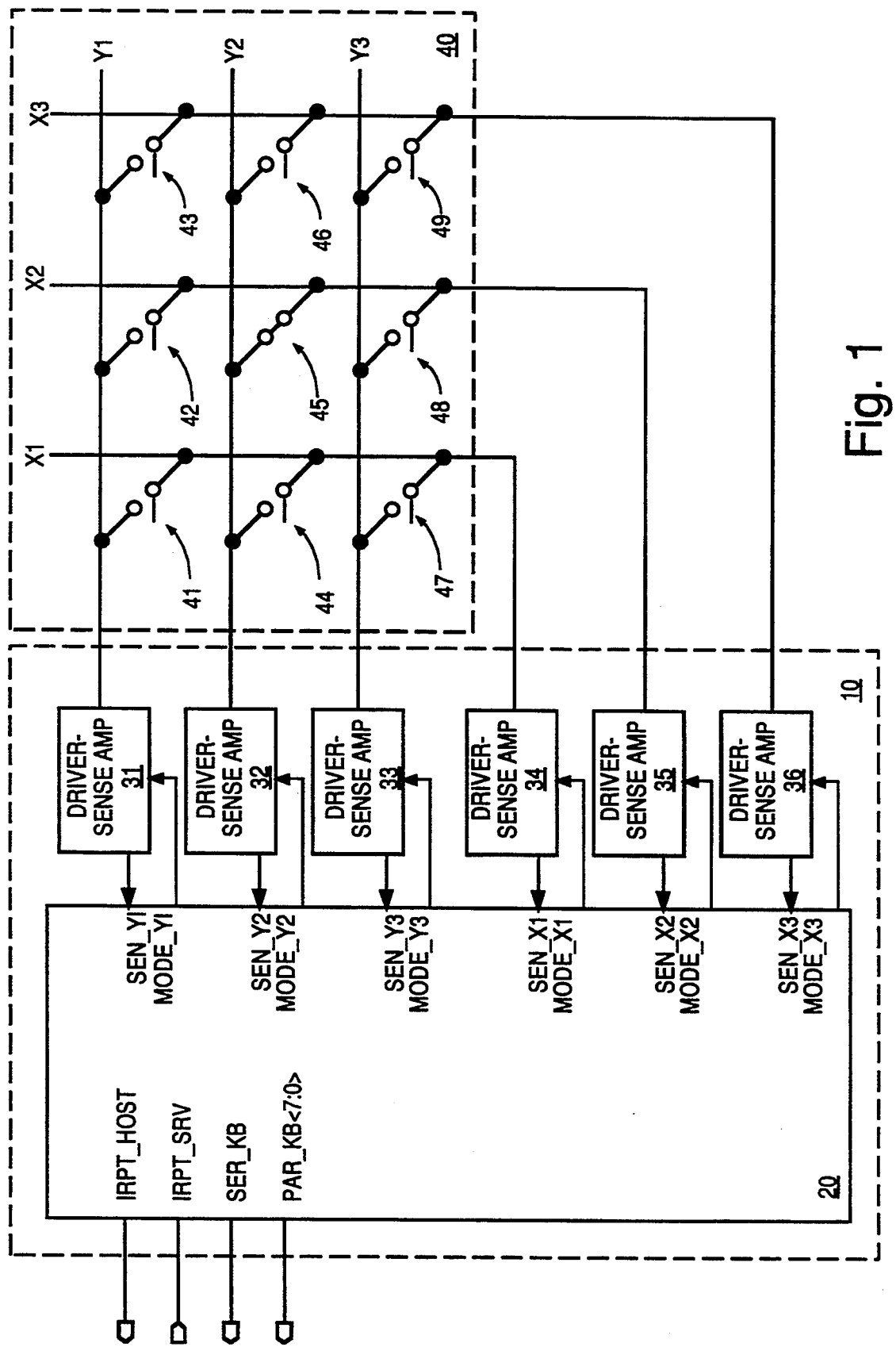
FIG. 1 is a schematic block diagram of a keyboard and keyboard controller.

FIG. 1 shows a keyboard interface controller 10 comprising controller 20 and a number of substantially identical driver-sense amplifiers 31–36. The interface controller 10 is connected to a keyboard 40, which illustratively comprises nine keyboard switches 41–49 arranged in a three by three matrix. It will be understood that the number and arrangement of switches in the keyboard 40, hence the number of driver-sense amplifiers in the interface controller 10, are exemplary, and that other arrangements and a greater or lesser number of keys may be used as desired. The controller 20 provides two signal lines for each driver-sense amplifier. For example, driver-sense amplifier 32, which is associated with line Y2 and switches 44, 45 and 46 of the keyboard 40, is connected to the controller 20 by sense line SEN_Y2 and mode select line MODE_Y2. Similarly, the driver-sense amplifier 35, which is associated with the second column of the keyboard 40, is connected to the controller 20 by sense line SEN_X2 and mode select line MODE_X2.

Controller 20 is basically a state machine that is placed in an idle mode after initialization. Upon being awakened by an interrupt upon key closure, controller 20 sequences through the steps of (a) determining the other axis of the keyboard; (b) converting the crosspoint to a unique code; (c) transmitting the crosspoint code to the host; and (d) checking for either another closure or the release of the closure detected. The interface controller 10 generally functions to (a) set the direction of input/output signal flow to or from the keyboard 40 in accordance with the MODE signal from controller 20; (b) force active/inactive levels on the outputs to one side of the keyboard 40 while sensing the state of the inputs from another side of the keyboard 40 at terminal SEN of the controller 20; (c) recognize an input level or an input transition to cause an interrupt at terminal SEN of the controller 20; (d) selectively enable or disable interrupts at the terminal SEN of the controller 20; and (e) handle two or more keys on a line and selectively identify them. With respect to the last point, it is noted that the prior art key scanning technique is unable to detect accurately certain combinations of closed keys, so that completely accurate detection of all closed key combinations is not a requirement for the controller interface 10.

Once a key closure or a key release is identified, the information is communicated to the host in any suitable manner. For example, one technique is to interrupt the host with a signal on line IRPT_HOST. When appropriate, the host signals the keyboard controller 20 over interrupt service line IRPT_SRV to read a key closure or release identifier from the keyboard buffer. The key identifier is transmitted to the host over either the serial key identifier line SER_KB or the parallel key identifier line PAR_KB <7:0>, as desired.

The operation of the interface controller 10 in detecting and communicating key down and key up events is illustrated in the pseudocode listings of FIG. 2, which is similar to a flowchart but lacks the graphical aspect. The interface controller 10 is initialized prior to key down and key up event detection, which involves among other activities resetting internal "tags" used for keeping track of the closure/release status of the keys of the keyboard 40. Tags are implemented in either hardware or software, and may be in the form of X,Y key identifiers, a keyboard bit map, or any other suitable form.

The sequence of pseudocode shown in FIG. 2 includes key closure events and key release events. Key closure and key release events are important events in keyboard control, since they are interpreted by the host computer as input. For example, in some computer-implemented applications, the pressing and release of an alpha key while the ALT key is held down will cause one type of operation to occur, and the subsequent release of the ALT key will have no apparent effect. However, the pressing and release of the ALT key without pressing any other key will cause another type of operation to occur. Also, the duration a particular key is held down can be determined from key closure and key release event information, if desired. For example, a long interval between key closure and key release events for an alphanumeric key typically is interpreted as a repetition of the character, while the interval between key closure and key release events for the ALT key typically is ignored.

Initially, the interface controller 10 is waiting for the first key closure event. The first sequence shown in FIG. 2, which begins at comment 100, is a first key closure event detection sequence. Step 102 is an X line activation step. As no keys are closed initially, no X,Y closed key locations are identified and no X or Y lines are considered tagged. All X lines are activated, and in step 104 all Y lines are monitored. Preferably, the Y lines are monitored for an interrupt. The use of interrupt monitoring enables placing the interface controller 10 in a stop mode or in an idle mode until an interrupt occurs to signal the first key closure event. Step 106 is a stop or idle step in which the interface controller 10 is stopped or idled until the occurrence of a Y line interrupt. In stop mode, no alternating current power is drawn by the interface controller 10, so that no electromagnetic interference is generated and power consumption is minimal. The clock for the interface controller 10 is also stopped. Idle mode is similar to stop mode, except that the clock is kept running for timer operations, thereby causing some AC power to be drawn. Nonetheless, electromagnetic interference and power consumption are still low, since no AC power is applied to the keyboard 40.

When an interrupt occurs, the interrupted Y line is tagged in step 108 since it identifies the Y location component of a closed key. Next, the directions of the signals to and from the keyboard 40 are reversed to identify the X location component of the closed key, as shown in steps 110, 112 and 114. In step 110, the new tagged Y line is activated while in step 112 the X lines are monitored to detect an active X line. Depending on the design of the drivers-sense amplifiers 31–36, one may want to deactivate all previously activated lines (in this case the X lines) before activating the new lines (in this case the tagged Y line). The active X line is tagged in step 114, thereby completing the identification of the X,Y location of key closure. The X,Y closure location is communicated to the host in step 116.

The second sequence of steps, which begins with comment 120, is to detect additional key closure events that occur on X lines other than the tagged X lines. The untagged X lines are activated in step 122, and all of the Y lines are monitored in step 124 to detect an active Y line. If no active Y line is detected, then no additional keys have been closed, and control passes to the next sequence of steps beginning at step 142, which is to detect additional key closure events and key release events that occur on the tagged X lines. If an active Y line is detected, then an additional key has been closed. The active Y line is tagged in step 128, since it identifies the Y location component of a closed key. Next, the directions of the signals to and from the keyboard 40 are reversed to identify the X location component of the closed key, as shown in steps 130, 132 and 134. In step 130, the new tagged Y line is activated while in step 132 the untagged X lines are monitored to detect an active X line. The active X line is tagged in step 134, thereby completing the identification of the X,Y location of key closure. The X,Y closure location is communicated to the host in step 136, and control is passed back to the X line activation step 122.

The third sequence of steps, which begins with comment 140, is to detect additional key closure events and key release events that occur on the tagged X lines. One of the tagged X lines is activated in step 142, and one of the tagged Y lines is monitored in step 144 to detect whether the Y line is active or inactive. If the monitored Y line is still active, then the key at the identified X,Y location is still closed and step 146 passes control to step 152. If the monitored Y line is not active, then the key at the identified X,Y location has been released. In this event, the X,Y location tag is removed in step 148, the X,Y release location is communicated to the host in step 150, and control passes to step 152.

Step 152 determines whether any tagged Y lines for keys associated with the active X line have not yet been monitored. If one is found, control is passed back to step 144, where one of the tagged Y lines (for keys associated with the active X line) that had not previously been monitored is now monitored. If none is found, control passes to step 160, which begins a sequence of steps that checks for a new closure of a key associated with the active X line.

The untagged Y lines for keys associated with the active X line are monitored in step 160 to check for a new key closure. If no active untagged Y line is detected, then no new key closure has occurred. In this event, step 162 passes control to step 170. If an active untagged Y line is detected, then a new key closure has occurred. In this event, step 162 passes control to step 164, in which the active Y line is tagged to identify the Y component of the new key closure. Since the X component is known from the active X line, the X,Y closure location is known, and is communicated to the host in step 166.

In step 170, a determination is made whether all tagged X lines have been activated. If not, control is returned to step 142 in which a previously inactivated X line is activated. If all tagged X lines have been activated, then control passes to step 180.

In step 180, a determination is made whether any X,Y locations are still tagged. If so, then additional key closure events and key release events must be checked for. Accordingly, control is returned to step 122. If not, then the interface controller 10 may be returned to stop mode or idle mode. Accordingly, control is returned to step 102.

Figure 3:
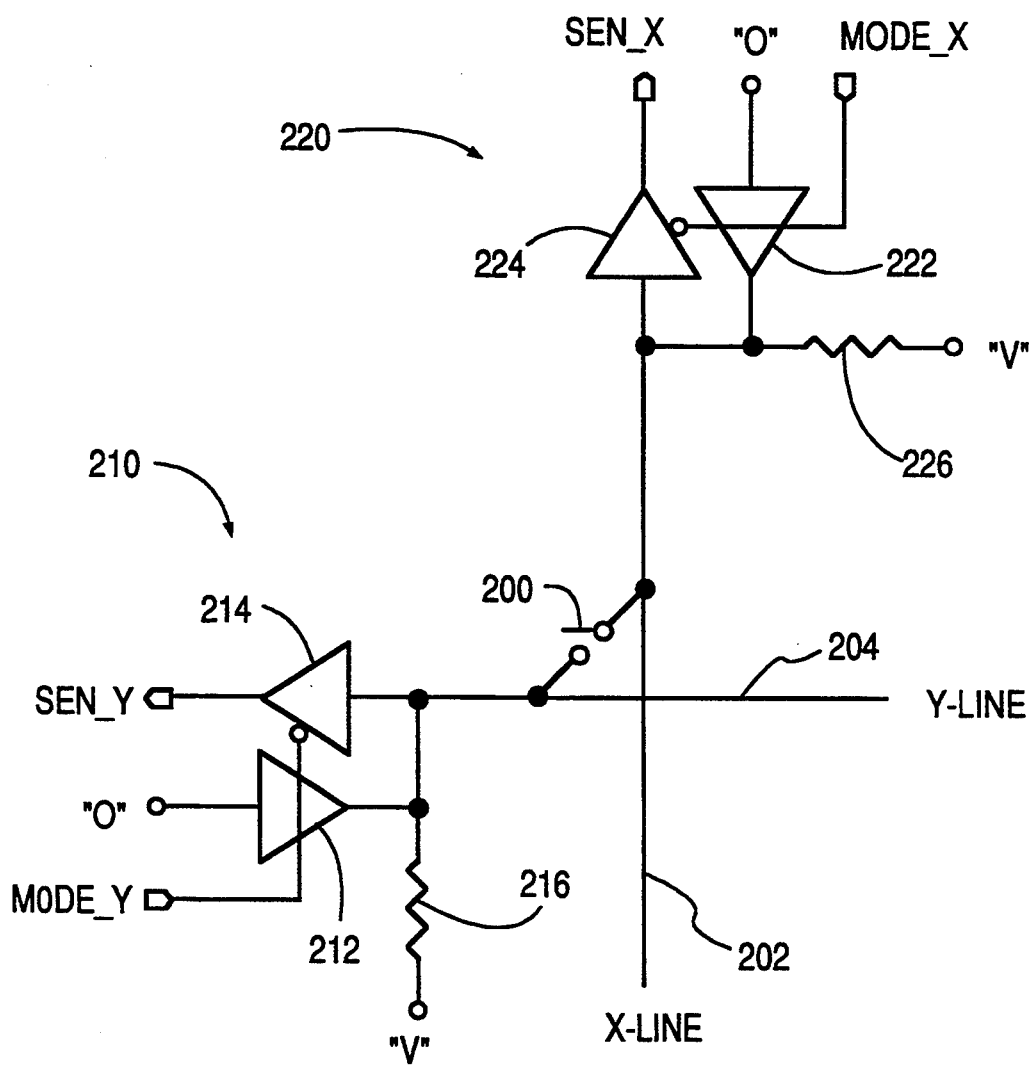
FIG. 3 is a detailed schematic diagram of an illustrative arrangement of drivers-sense amplifiers for a keyboard.

Illustrative drivers-sense amplifiers suitable for use as drivers-sense amplifiers 31 through 36 are shown in FIG. 3. A key 200 is located across X-line 202 and Y-line 204. Driver-sense amplifier 210 includes driver 212, sense amplifier 214, and pull-up resistor 216. Driver-sense amplifier 220 includes driver 222, sense amplifier 224, and pull-up resistor 226. Signal MODE_X is brought high, which turns off sense amplifier 224 and turns on driver 222 to activate X-line 202 by bringing it low. The entire supply voltage V is dropped across pull-up resistor 226. Signal MODE_Y is brought low, which turns on sense amplifier 214 and turns off driver 212. Resistor 216 acts to pull-up Y-line 204, and sense amplifier 214 responds by bringing signal SEN_Y high to indicate an open key 200. Were key 200 closed, driver 222 would pull down Y-line 204, and sense amplifier 214 would respond by bringing signal SEN_Y low to indicate a closed key 200.

To activate the Y-line 204 and sense the X-line 202, signal MODE_X is brought low and signal MODE_Y is brought high.

Figure 4:
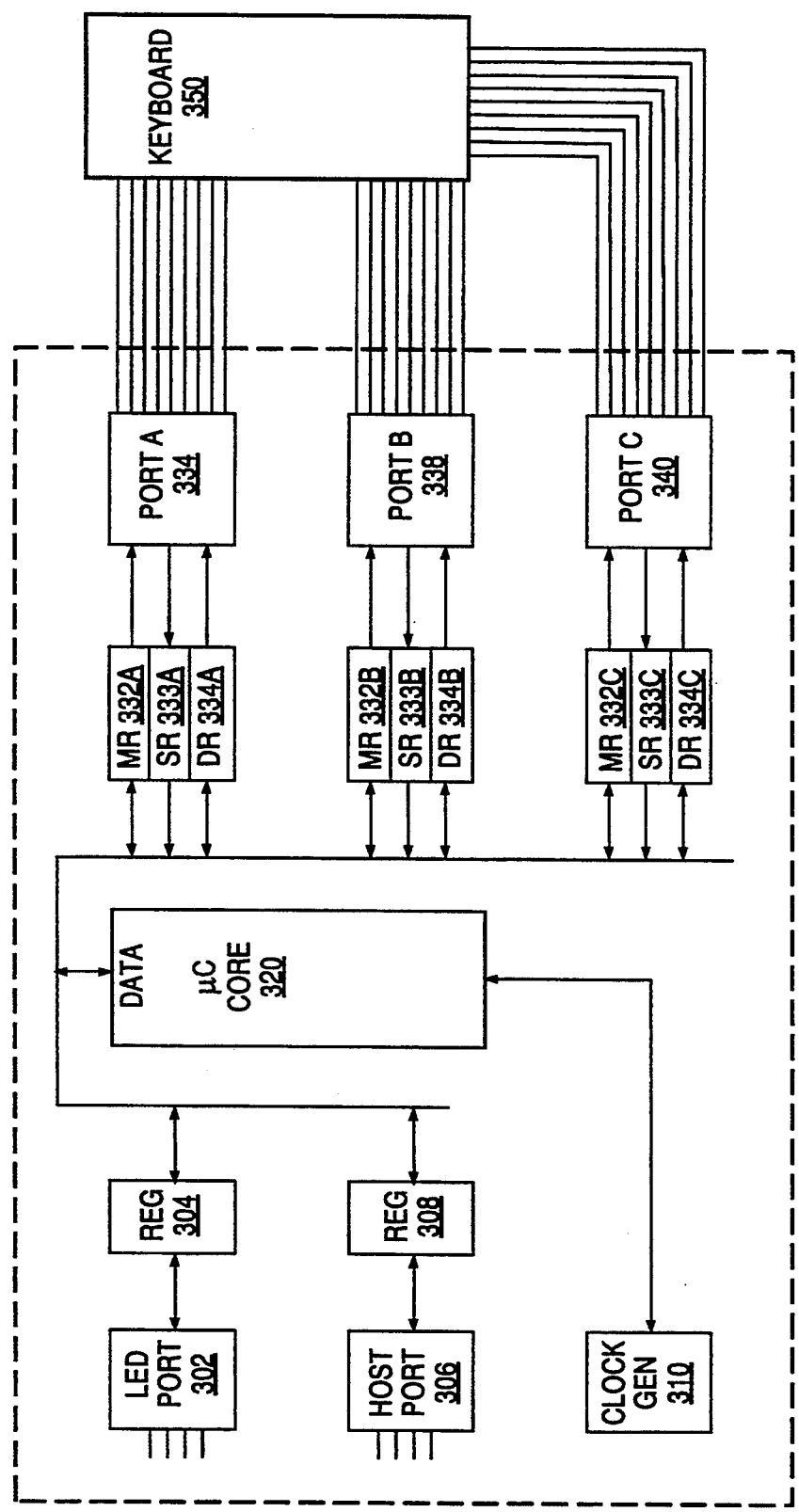
FIG. 4 is a block schematic diagram of a microcontroller implementation of a keyboard interface controller.

The controller 20 is implemented in any suitable manner, including by programmable microcontroller, discrete hardware logic, programmable logic array, and gate array. An exemplary single-chip microcontroller-based implementation 300 of the interface controller 10 programmed in accordance with the pseudocode of FIG. 2 is illustrated in FIG. 4. The keyboard 350 to which the microcontroller 300 is connected is a 16×8 array of keys. The implementation 300 has five ports, A port 334, B port 338, and C port 340 being keyboard ports, LED port 302 being for light emitting diode indication, and host port 306 being for host computer communications. A microcontroller core 320 communicates with LED port 302 through a register 304; with host port 306 through a register 308; with keyboard port 334 through a mode register 332A, a sense register 333A, and a data out register 334A; with keyboard port 338 through a mode register 332B, a sense register 333B, and a data out register 334B; and with keyboard port 340 through a mode register 332C, a sense register 333C, and a data out register 334C. Normally, each bit of the data out register 334 is logic 0 to provide an active low on the driven line, as shown in FIG. 3. Nonetheless, greater flexibility is afforded by the inclusion of the data out register 334. Note that illustratively, each of the ports 334, 338 and 340 has an associated set of mode, sense and data out registers. A clock generator 310 is connected to the microcontroller core 320.

The microcontroller 300 is based on a source-destination architecture that makes any register or I/O port an accumulator on a specific instruction, and contains a central processing unit, interrupt controller, read-only memory, working registers, I/O/data/control registers, and system registers.

The I/O section includes three 8-bit ports, which are keyboard ports 334, 338, and 340; and two 4-bit ports, which are the LED port 302 and the host port 306. The microcontroller core 320 accesses these ports by writing to or reading from their register addresses. The C port 340 and the host port 306 contain interrupt requests modes that accommodate the application of an interrupt signal to terminate stop or idle mode. For flexibility, the ports are configurable in a number of ways.

Keyboard ports 334 and 338 need only be nibble controllable ports, configured by identical 8-bit control registers with bits <7:4> controlling the upper nibble configuration and bits <3:0> controlling the lower nibble.

Keyboard port 340 is a single pin controllable port configured by 8-bit control registers. In addition to being able to operate as normal I/O pins, the pins of port 340 also operate as interrupt pins in idle mode. For example, when any pin of the port 340 has its corresponding interrupt enable bit set and is also configured as an input pin with a Schmitt trigger, any data edge, rising, falling, or both, generates an interrupt.

LED port 302 is a nibble controllable port, and in this respect is similar to keyboard ports 334 and 338. Port 302 is also designed for high current applications, of sufficient magnitude to drive light emitting diodes, for example.

Host port 306 is a single pin controllable port, generally similar to keyboard port 340 in mode of operation.

The input modes of the ports 334, 338, 340, 302 and 306 are configured with Schmitt triggers, with or without pull-up resistors. The output modes can be selected as push-pull, open drain, or pull-up type.

While the invention has been described with respect to the embodiments set forth above, other embodiments and variations not described herein may be within the scope of the invention. Accordingly, other embodiments, variations and improvements not described herein may be within the scope of the invention, which is defined by the following claims.

What is claimed is:

1. A method of encoding the activation of a switch of a group of switches, the switches being designated by respective X,Y locations, and each of the switches having a first terminal designated by the X location thereof, and a second terminal designated by the Y location thereof, comprising the steps of:

activating a switch;
energizing the first terminals of the switches to energize the second terminal of the activated switch;
monitoring the second terminals of the switches to identify from the energized second terminal a Y location of the activated switch;
energizing the second terminals of the switches designated by the identified Y location to energize the first terminal of the activated switch; and monitoring the first terminals of the switches to identify from the first terminal energized in the second terminals energizing step an X location of the activated switch.

2. A method as in claim 1, further comprising the step of monitoring the first terminals of the switches designated by the identified X location to detect a deactivation of the activated switch.

3. A method as in claim 1, wherein:
the first terminals energizing step comprises bringing the first terminals to a static voltage; and
the second terminals energizing step comprises bringing the second terminals of the switches designated by the identified Y location to a static voltage.

4. A method as in claim 3, wherein:
the step of monitoring the second terminals comprises monitoring the second terminals of the switches for the static voltage with a plurality of sense amplifiers; and
the step of monitoring the first terminals comprises monitoring the first terminals of the switches for the static voltage with a plurality of sense amplifiers.

5. A method as in claim 1, wherein:
the first terminals energizing step comprises bringing the first terminals to ground potential; and
the second terminals energizing step comprises bringing the second terminals of the switches designated by the identified Y location to ground potential.

6. A method as in claim 5, wherein:
the step of monitoring the second terminals comprises monitoring the second terminals of the switches for the ground potential with a plurality of sense amplifiers; and
the step of monitoring the first terminals comprises monitoring the first terminals of the switches for the ground potential with a plurality of sense amplifiers.

7. A method as in claim 1, further comprising, following the step of monitoring the second terminals, the step of deenergizing the first terminals energized in the first terminals energizing step.

8. A method as in claim 1, wherein during the step of energizing the second terminals, only the second terminals of the switches designated by the identified Y location are energized.

9. A method as in claim 1, further comprising the steps of:
energizing the first terminals of the switches designated by the identified X location; and
monitoring the second terminals of the switches designated by the identified Y location to detect a deactivation of the activated switch.

10. A method as in claim 1, further comprising the steps of:
preceding the step of energizing the first terminals, placing an interface controller in a stop mode; and
following the step of monitoring the second terminals, placing the interface controller in an unstopped mode.

11. An interface controller for a keyboard having a plurality of keys arranged conceptually on a grid of X-designated conductors and Y-designated conductors, each key being at a crossing of an X-conductor and a Y-conductor and having one terminal connected to the X-conductor and another terminal connected to the Y-conductor, comprising:

a plurality of controllable driver-sense circuit pairs respectively associated with the X-conductors of the keyboard;
a plurality of controllable driver-sense circuit pairs respectively associated with the Y-conductors of the keyboard; and
control logic coupled to the driver-sense circuit pairs respectively associated with the X-conductors and Y-conductors for activating the drivers associated with the X-conductors and the sense circuits associated with the Y-conductors to identify a Y-conductor that is connected to a closed key, and for activating the driver associated with the identified Y-conductor and the sense circuits associated with the X-conductors to identify an X-conductor that is connected to the closed key.

12. A controller as in claim 11 further comprising interrupt logic for bringing the controller to an AC power down mode in the absence of any Y-conductor connected to a closed key, and for bringing the controller to an AC power up mode upon a first identification of a Y-conductor connected to a closed key.

13. A controller as in claim 12 further comprising additional interrupt logic for bringing the controller to an unclocked mode in the absence of any Y-conductor connected to a closed key, and for bringing the controller to a clocked mode upon a first identification of a Y-conductor connected to a closed key.

14. A controller as in claim 11 further comprising further control logic for activating the driver associated with the identified Y-conductor and the sense circuit associated with the identified X-conductor to detect an opening of the closed key.

15. A controller as in claim 11 further comprising:
first additional control logic for activating the driver associated with the identified X-conductor and the sense circuits associated with the Y-conductors other than the identified Y-conductor to identify a second closed key; and
second additional control logic for activating the drivers associated with the X-conductors other than the identified X-conductor and the sense circuits associated with the Y-conductors to identify a Y-conductor that is connected to a third closed key, and for activating the driver associated with the identified Y-conductor connected to the third closed key and the sense circuits associated with the X-conductors other than the identified X-conductor to identify an X-conductor connected to the third closed key.

16. A method of encoding the activation of a switch of a group of switches, the switches being designated by respective X,Y locations, and each of the switches having a first terminal designated by the X location thereof, and a second terminal designated by the Y location thereof, comprising the steps of:
placing a first signal on the first terminals of the switches;
monitoring the second terminals of the switches to detect the first signal, the detected first signal identifying a Y location of an activated switch;
placing a second signal on the second terminals of the switches designated by the identified Y location; and
monitoring the first terminals of the switches to detect the second signal, the detected second signal identifying an X location of the activated switch.

17. A method as in claim 16, further comprising the steps of:
placing a third signal on the second terminals of the switches designated by the identified Y location; and
monitoring the first terminals of the switches associated with the identified X location to detect a removal of the third signal, the detected removal of the third signal identifying a deactivation of the activated switch.

18. A method as in claim 17, wherein:
the step of placing a first signal comprises placing a static voltage on the first terminals;
the step of placing a second signal comprises placing a static voltage on the second terminals of the switches designated by the identified Y location; and
the step of placing a third signal comprises placing a static voltage on the second terminals of the switches designated by the identified Y location.

19. A method as in claim 18, wherein:
the step of monitoring the second terminals comprises monitoring the second terminals of the switches for the static voltage with a plurality of sense amplifiers; and
the steps of monitoring the first terminals comprise monitoring the first terminals of the switches for the static voltage with a plurality of sense amplifiers.

20. A method as in claim 17, wherein:
the step of placing a first signal comprises placing the first terminals at ground potential;
the step of placing a second signal comprises placing the second terminals of the switches designated by the identified Y location at ground potential; and
the step of placing a third signal comprises placing the second terminals of the switches designated by the identified Y location at ground potential.

21. A method as in claim 20, wherein:
the step of monitoring the second terminals comprises monitoring the second terminals of the switches for the ground potential with a plurality of sense amplifiers; and
the steps of monitoring the first terminals comprise monitoring the first terminals of the switches for the ground potential with a plurality of sense amplifiers.

22. A method as in claim 16, wherein during the step of placing a second signal, a second signal is placed only on the switches designated by the identified Y location.

23. A method as in claim 16, further comprising the steps of:
preceding the step of placing a first signal, placing an interface controller in an energy conservation mode; and
following the step of monitoring the second terminals, energizing the interface controller.

24. A method as in claim 23 wherein:
the step of placing the interface controller in the energy conservation mode comprises placing the interface controller in an unclocked mode; and
the step of energizing the interface controller comprises placing the interface controller in a clocked mode.

25. A method of identifying an activated switch in a group of switches wherein each switch is individually associated with one of a plurality of column conductors and one of a plurality of row conductors, comprising the steps of:
placing a first signal on the column conductors, wherein the first signal is communicated to a first one of the row conductors through a first activated switch;
sensing the first signal on the first row conductor;
placing a second signal on the first row conductor in response to the sensing step, wherein the second signal is communicated to a first one of the column conductors through the first activated switch; and
sensing the second signal on the first column conductor.

26. A method as in claim 25 wherein during the step of placing a second signal, a second signal is placed only on the first row conductor.

27. A method as in claim 25, further comprising the steps of:
placing a third signal on the column conductors except for the first column conductor, wherein the third signal is communicated to a second one of the row conductors through a second activated switch;
sensing the third signal on the second row conductor;
placing a fourth signal on the second row conductor in response to the sensing the third signal step, wherein the fourth signal is communicated to a second one of the column conductors through the second activated switch; and
sensing the fourth signal on the second column conductor.

28. A method as in claim 25, further comprising the steps of:
placing a fifth signal on the first row conductor, wherein the fifth signal is communicated to the first column conductor through the first activated switch; and
sensing a removal of the fifth signal from the first column conductor to detect deactivation of the first switch.

29. A method as in claim 25, further comprising the step of storing the location of the switch associated with the first row conductor and the first column conductor.

30. A method as in claim 25, further comprising the steps of:
sensing a voltage level on each of the plurality of row conductors with an individual driver-sense amplifier pair; and
sensing a voltage level on each of the plurality of column conductors with an individual driver-sense amplifier pair.

31. A method of encoding the activation of a switch of a group of switches arranged on a keyboard wherein the switches are coupled to a plurality of first conductors and second conductors, each of the switches being coupled between a respective different pair of the first conductors and the second conductors, comprising the steps of:
placing a first signal on the first conductors, wherein the first signal is communicated through a first activated switch to a second conductor coupled to the first activated switch;
monitoring the second conductors to detect the first signal, the detected first signal identifying the second conductor coupled to the first activated switch;
placing a second signal on the identified second conductor coupled to the first activated switch, wherein the second signal is communicated through the activated switch to a first conductor coupled to the first activated switch; and monitoring the first conductors to detect the second signal, the detected second signal identifying the first conductor coupled to the first activated switch.

32. A method as in claim 31, further comprising the steps of:

monitoring the identified first conductor coupled to the first activated switch to detect a removal of the second signal, the detected removal of the second signal identifying the deactivation of the first activated switch.

33. A method as in claim 31, further comprising the steps of:

placing a third signal on the identified first conductor coupled to the first activated switch, wherein the third signal is communicated through the activated first switch to the identified second conductor coupled to the first activated switch;

monitoring the identified second conductor coupled to the first activated switch to detect a removal of the third signal, the detected removal of the third signal identifying the deactivation of the first activated switch.

34. A method as in claim 33, further comprising the steps of:

placing a fourth signal on the first conductors except for the identified first conductor coupled to the first activated switch, wherein the fourth signal is communicated through an activated second switch to a second conductor coupled to the activated second switch;

monitoring the second conductors to detect the fourth signal, the detected fourth signal identifying the second conductor coupled to the second activated switch;

placing a fifth signal on the identified second conductor coupled to the second activated switch, wherein the fifth signal is communicated through the activated second switch to a first conductor coupled to the activated second switch; and monitoring the first conductors to detect the fifth signal, the detected fifth signal identifying the first conductor coupled to the second activated switch.

35. A method as in claim 34, wherein:

the step of placing a first signal comprises placing a static voltage on the first conductors;

the step of placing a second signal comprises placing a static voltage on only the identified second conductor coupled to the identified first activated switch;

the step of placing a third signal comprises placing a static voltage on only the first conductor coupled to the identified first activated switch;

the step of placing a fourth signal comprises placing a static voltage on the first conductors except for the identified first conductor coupled to the identified first activated switch; and the step of placing a fifth signal comprises placing a static voltage on only the second conductor coupled to the identified second activated switch.

36. A method as in claim 34, further comprising the steps of:

storing the location of the first activated switch; and
storing the location of the second activated switch.

* * * * *